(12) United States Patent
Iguchi et al.

(10) Patent No.: US 6,830,995 B2
(45) Date of Patent: Dec. 14, 2004

(54) METHOD OF DIFFUSING ZINC INTO ARTICLE AND METHOD OF HEATING ARTICLE

(75) Inventors: Yasuhiro Iguchi, Itami (JP); Takashi Ishizuka, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/373,185

(22) Filed: Feb. 26, 2003

(65) Prior Publication Data

US 2003/0186520 A1 Oct. 2, 2003

(30) Foreign Application Priority Data

Feb. 26, 2002 (JP) .................................... P2002-050163

(51) Int. Cl.[7] .............................................. H01L 21/24
(52) U.S. Cl. ...................................... 438/541; 438/569
(58) Field of Search ................................. 438/537, 540, 438/541, 566, 567, 568, 569

(56) References Cited

U.S. PATENT DOCUMENTS 4,510,514 A * 4/1985 Camlibel et al. ........... 438/605
5,122,478 A * 6/1992 Uesugi ....................... 438/563
5,731,213 A * 3/1998 Ono ........................... 438/964
6,214,708 B1   4/2001 Iguchi et al.

OTHER PUBLICATIONS

"Enhanced indium phosphide substrate protection for liquid phase epitaxy growth of indium–gallium–arsenide–phosphide double heterostructure lasers" P. Besomi et al., J. Appl. Phys. 54 (2) (1983) pp. 535–539.

"Prevention of InP surface decomposition in liquid phase epitaxial growth" G. A. Antypas, Appl. Phys. Lett. 37 (1) (1980) pp. 64–65.

* cited by examiner

*Primary Examiner*—Chandra Chaudhari
(74) *Attorney, Agent, or Firm*—McDermott Will & Emery LLP (57) ABSTRACT

Provided is a method of heating a semiconductor substrate having a surface of a III-V compound semiconductor containing phosphorus as a group V constituent element. The method comprises the steps of: (a) providing an alloy in a heating furnace, the alloy including tin, indium, and phosphorus as main constituents; and (b) raising a temperature of the article in an atmosphere containing vapor of phosphorus supplied from the alloy.

19 Claims, 10 Drawing Sheets

METHOD OF DIFFUSING ZINC INTO ARTICLE AND METHOD OF HEATING ARTICLE

BACKGROUND OF THE INVENTION

1. Field of the Invention

The present invention relates to a method of diffusing zinc into an article having a surface of III-V compound semiconductor containing phosphorus as a group V constituent element, and a method of heating an article having a surface of III-V compound semiconductor containing phosphorus as a group V constituent element.

2. Related Background Art

In manufacturing a semiconductor device on an InP substrate, steps of heating the InP substrate are carried out, such as a step of diffusing zinc into the InP substrate and a step of annealing the InP substrate after implanting ions into the InP substrate. In these heating steps, the InP substrate is heated to a high temperature of, for example, about 550 degrees centigrade. When the InP substrate is heated at such a high temperature, InP in a surface of the InP substrate is thermally decomposed into indium and phosphorus individually. A large part of the phosphorus is sublimed into the vapor phase because vapor pressure of phosphorus is higher than that of indium. So-called phosphorus loss phenomenon occurs in the surface of the InP substrate. When the loss of phosphorus occurs, a number of defects are generated in the surface of the InP substrate.

The loss of phosphorus occurs not only in the InP substrate but also in a GaP substrate, and furthermore, the loss of phosphorus occurs in a semiconductor film such as $Ga_xIn_{1-x}P$ (0<x<1) grown on a GaAs substrate.

SUMMARY OF THE INVENTION

Japanese Patent Laid-Open No. 2000-49105 publication, for example, discloses a method of preventing the loss of phosphorus. In the method disclosed in the publication, a non-doped InP substrate having a surface roughened (hereinafter, referred as to a dummy substrate) is prepared. The dummy substrate is disposed such that the roughened surface faces the surface of the InP substrate. Thereafter, the InP substrate and the dummy substrate are heated. During the heating, phosphorus is sublimed from the dummy substrate to form phosphorus vapor, and the surface of the InP substrate is exposed to the phosphorus vapor at a predetermined vapor pressure. The phosphorus vapor serves to prevent the loss of phosphorus in the InP substrate.

However, the method as described above cannot be available as the InP substrate increases in diameter. The diameter of the dummy substrate need to be larger than that of the InP substrate because the entire surface of the InP substrate should be exposed to a phosphorus vapor. If an InP substrate having the diameter of four inches, which is widely used at present, is heated by use of the method, the diameter of a dummy substrate should be more than 4 inches. But, it is not easy to obtain a dummy substrate of a diameter more than 4 inches. The dummy substrate of four-inch diameter is expensive, if obtained, and thus the use of the expensive dummy substrate increases costs required for steps of heating the InP substrate.

In light of such a matter, the inventors have examined a method of heating the InP substrate without using the dummy substrate and have thereby attained the present invention.

It is an object of the present invention to provide a method of diffusing zinc into an article having a surface of III-V compound semiconductor containing phosphorus as a group V constituent element, without loss of phosphorus from the surface thereof, and to provide a method of diffusing zinc into the article.

One aspect of the present invention is a method of diffusing zinc into an article having a surface of a III-V compound semiconductor containing phosphorus as a group V constituent element. The method includes the steps of: (a) providing the article, an alloy, and a material source containing zinc and phosphorus in a heating furnace, the alloy including tin, indium and phosphorus as main constituents; (b) increasing a temperature of the article in an atmosphere containing vapor of phosphorus supplied from the alloy; and (c) exposing a surface of the article in an atmosphere containing vapor of zinc and phosphorus from the material source to diffuse zinc into the article.

In the method, the alloy may be produced from a combination of a tin material and an indium material, and one material of an indium phosphorus material and a phosphorus material. The combined material is prepared in a molar ratio of indium to tin of 0.65 or more but not exceeding 1.3.

In the providing step, the alloy is provided in a first container having a bottom portion. The first container is provided in the heating furnace such that the bottom portion of the first container faces a surface of the article. The bottom portion has a plurality of through holes therein. The material is provided in a second container. The second container is provided in the heating furnace. The second container may be provided adjacent to the first container. The second container includes an opening in a bottom portion thereof. In the heating step, the first container is provided such that the bottom portion faces the article. In the diffusing step, the second container is provided on the article.

Preferably, after the diffusing step, the method further includes the step of lowering temperature of the article in vapor of phosphorus produced from the alloy. This step prevents the loss of phosphorus in decreasing the temperature of the article.

Preferably, in the step of lowering the temperature as described above, the first container is provided such that the bottom portion of the first container faces the article. In this step, the surface of the article can be surely exposed to the vapor of phosphorus in decreasing the temperature of the article.

Preferably, in preparing the alloy, the tin material, the indium material, and any one of the indium phosphorus material and the phosphorus material is prepared to heat them at a temperature equal to or higher than a temperature at which the article is to be processed. After this preparation, the phosphorus concentration can be saturated in the alloy when the alloy is heated and the vapor of phosphorus is generated from the alloy.

Furthermore, it is preferable to contain the alloy including solid indium phosphorus or solid phosphorus when the surface of the article is exposed to the vapor of phosphorus generated from the alloy. When this alloy is used, the phosphorus concentration is saturated in the alloy.

Another aspect of the present invention is a method of heating an article having a surface of a III-V compound semiconductor containing phosphorus as a group V constituent element, the method comprising the steps of: (a) providing an alloy in a heating furnace, the alloy including tin, indium, and phosphorus as main constituents; and (b) raising a temperature of the article in an atmosphere containing vapor of phosphorus supplied from the alloy.

In this method, the alloy may be prepared from a combination of a tin material and an indium material and any one material of an indium phosphorus material and a phosphorus material. The combined material has a molar ratio of indium to tin of 0.65 or more but not exceeding 1.3.

Preferably, after the raising step, the heating method further includes the step of exposing the surface to the vapor of phosphorus produced from the alloy for a predetermined period of time while heating the article. This method prevents the loss of phosphorus in the article during the heating of the article for the predetermined time.

Preferably, after the exposing step, the heating method further includes the step of lowering temperature of the semiconductor substrate while exposing the surface of the article to the vapor of phosphorus produced from the alloy. This method prevents phosphorus atoms in the article from subliming in lowering the temperature of the article.

Preferably, in the providing step, the alloy is prepared in a container, provided in the heating furnace, having a bottom portion. The container is provided in heating furnace such that the bottom portion faces the surface of the article. The container has a plurality of through holes in the bottom portion. It is preferable that the bottom portion of the container faces the surface of the article in exposing the surface of the article to the vapor of phosphorus generated from the alloy. The loss of phosphorus from the article can be prevented.

Preferably, in preparing the alloy, the tin material, the indium material, and any one of the indium phosphorus material and the phosphorus material is heated at a temperature equal to or higher than that at which the article is to be heated. Moreover, the alloy contains any one material of a solid indium phosphorus material and a solid phosphorus material in exposing the surface to the vapor of phosphorus generated from the alloy.

DESCRIPTION OF THE PREFERRED EMBODIMENTS

Hereinafter, a number of preferred embodiments according to the present invention will be described with reference to the drawings as follows: a method of heating an article, such as a semiconductor substrate; a method of diffusing zinc into an article, such as a semiconductor substrate. In the drawings, the same or similar components are referred to as the same reference numerals and symbols, if possible.

(First Embodiment)

Figure 1A:
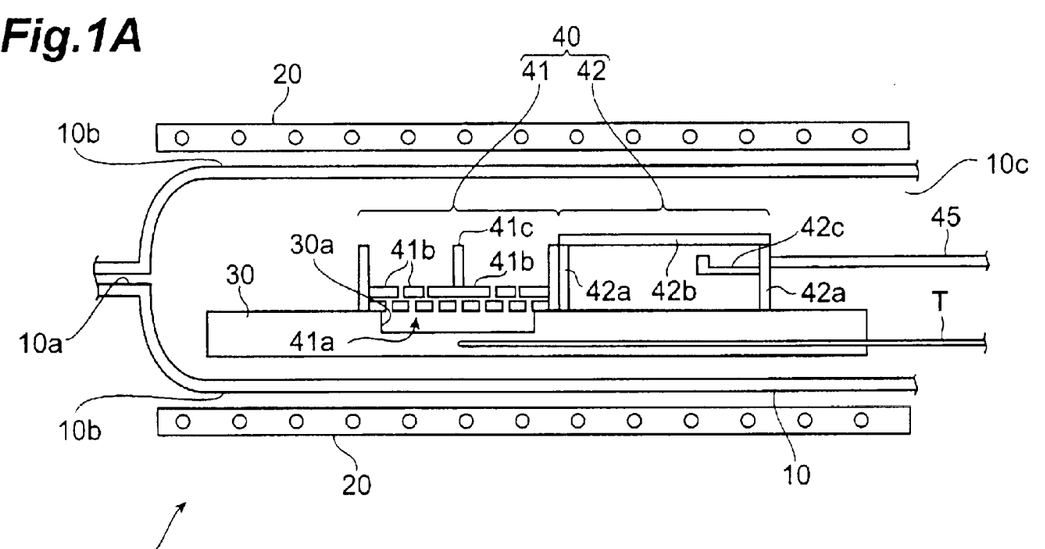
FIG. 1A is a schematic view showing an embodiment of a furnace.

A method of diffusing zinc into a semiconductor substrate according to the first embodiment of the present invention will be described in the following. FIG. 1A is a schematic view showing a furnace. A furnace described is preferably used for a process for an article, such as diffusion, heating and annealing. The furnace 1 includes a quartz tube 10, a heater 20, a support base 30, a tool 40, and an operation rod 45. The quartz tube 10 accommodates an InP substrate W. The heater 20 is provided so as to surround an outer circumferential surface 10b of the quartz tube 10. The support base 30 is placed in the quartz tube 10 and supports the substrate W. The tool 40 can be slidably moved on the support base 30. The operation rod 45 is provided for sliding the tool 40. The quartz tube 10 includes a gas supply port 10a and a gas exhaust port 10c.

Figure 1B:
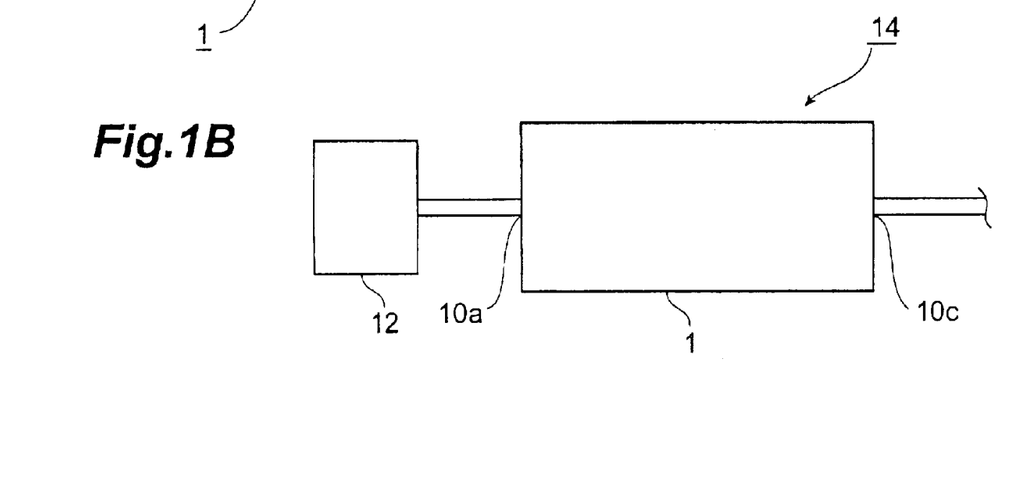
FIG. 1B is a schematic view showing an embodiment of a manufacturing system including the furnace.

FIG. 1B is a schematic view showing an embodiment of a manufacturing system including the furnace 1. In the manufacturing system 14, the gas supply port 10a is connected to a gas supply source 12. Purge gas, such as hydrogen ($H_2$) gas or nitrogen ($N_2$) gas, is supplied from the gas supply source 12 to the quartz tube 10 at a flow rate of about 1 to 3 liters per minute.

The support base 30 is provided with a depression, such as a receiving portion 30a, for receiving the substrate W thereon. The support base 30 has a temperature sensor, such as a thermocouple T, therein. The thermocouple T is provided to monitor the temperature of the substrate W. In order to monitor the temperature, the sensing portion of the thermocouple T is situated under the receiving portion 30a. The support base 30 can be made of high purity carbon. In order to prevent particles that may be generated when the tool 40 slides on the support base 30, it is preferable that the surface of the support base 30 is coated with a silicon carbide (SiC) film.

With reference to FIG. 1A, the tool 40 includes a boat 41 and a frame body 42, which are arranged in a direction in which the tool 40 is slid. The boat 41 includes bottom plates 41a and 41b and a frame portion 41c. The bottom plates 41a and 41b are adjacent to each other and the frame portion 41c is placed on the bottom plate 41b. The frame body 42 comprises a frame portion 42a and a cover portion 42b. The frame portion 42a is provided with a container, such as a shelf portion 42c. In the shelf portion 42c, a diffusion material 120 is provided. The diffusion material 120 will be described later.

Figure 2:
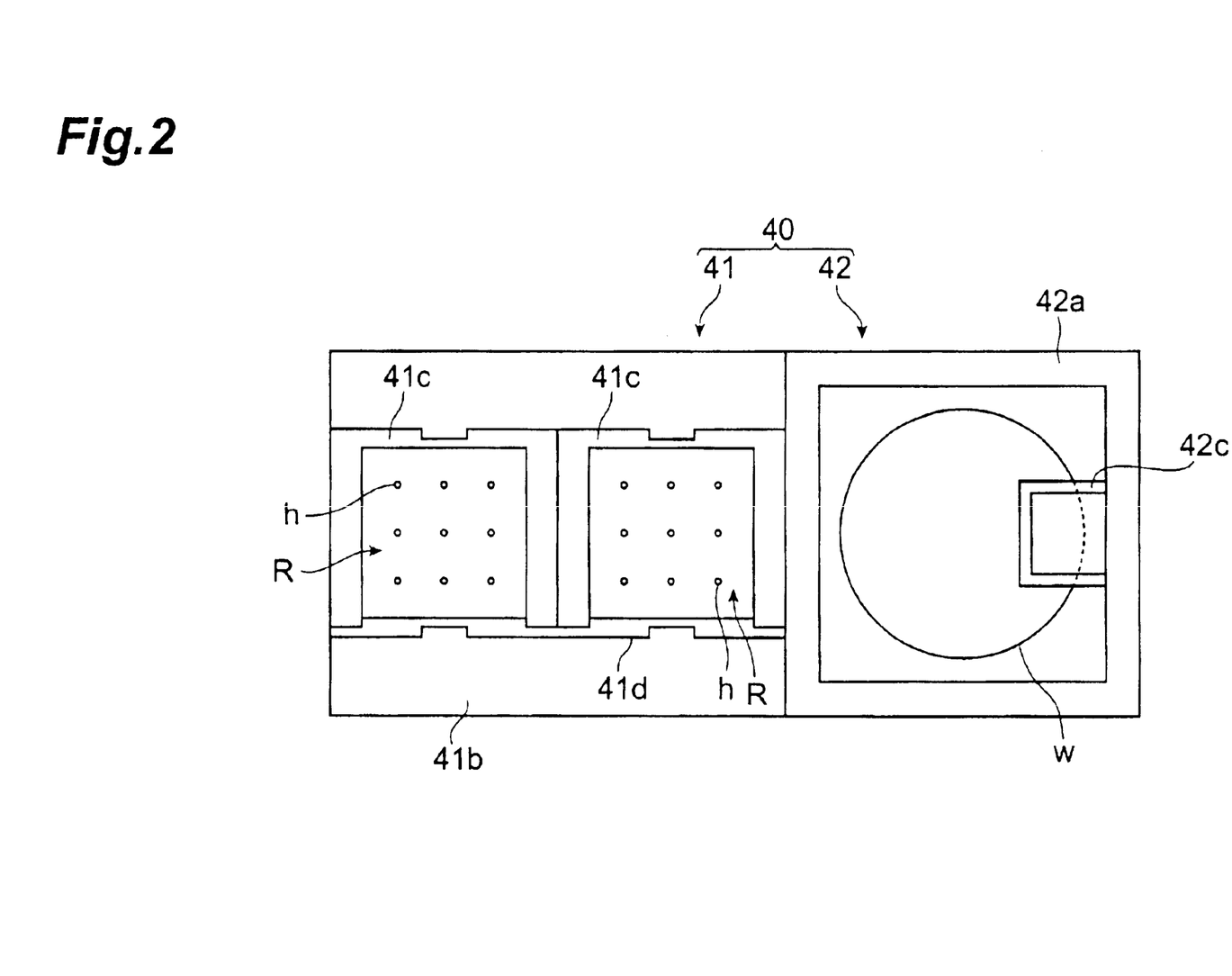
FIG. 2 is a top view showing a tool with the cover portion of the tool removed.

With reference to FIG. 2, the tool 40 will be described in detail. FIG. 2 is a top view showing the tool 40 in which the cover portion 42b is removed. On the bottom plate 41b, the boat 41 includes a plate 41d in addition to the frame portion 41c. The frame portion 41c and the plate 41d provide a region R as shown in the FIG. 2. A number of through holes h are arranged in the bottom plate 41b in the region R. An alloy is provided in the region R, and the alloy is mainly composed of Sn, In, and P as described later. The tool 40 is provided such that the frame portion 42a is situated over the substrate W. In the embodiment as shown in FIG. 2, the area of a region surrounded by the frame portion 42a is larger than that of the substrate W. Accordingly, the entire surface of the substrate W can be exposed to a vapor phase containing Zn and P generated from the diffusion material 120.

Figure 3A:
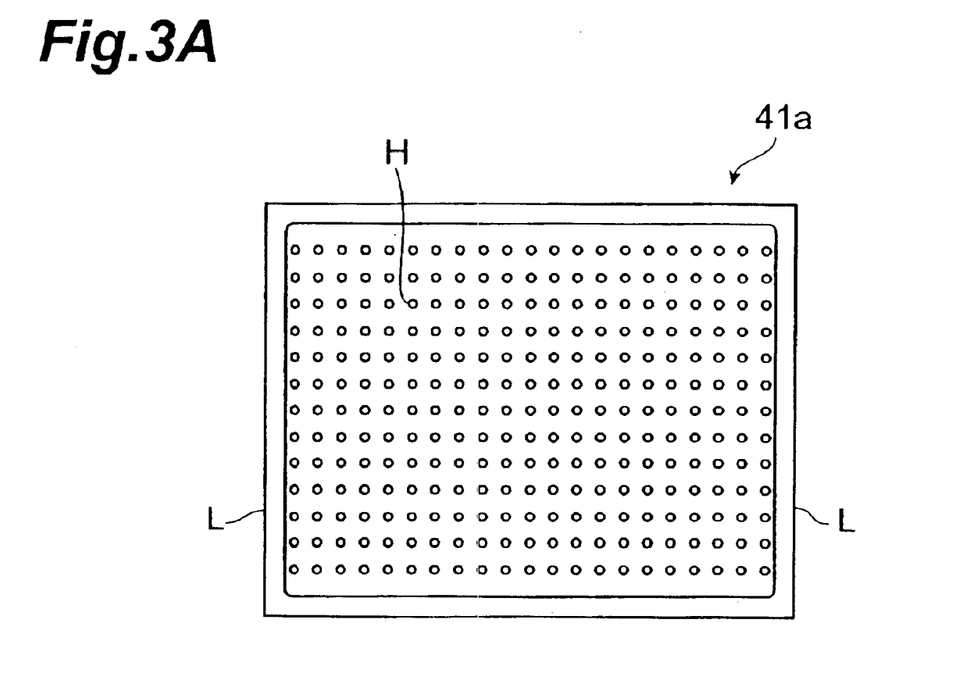
FIG. 3A is a plan view of one bottom plate.
Figure 3B:
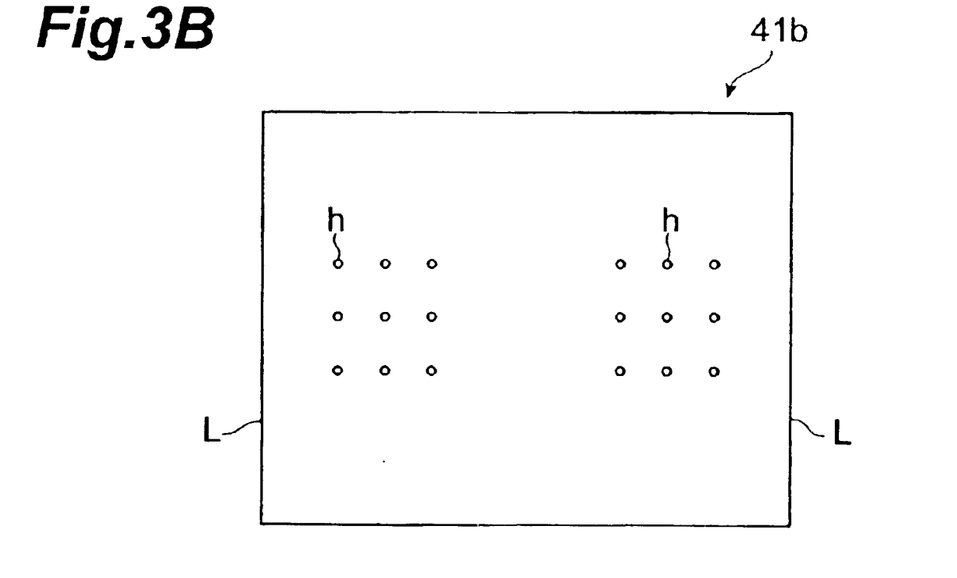
FIG. 3B is a plan view of another bottom plate.

FIG. 3A is a plan view of the bottom plate 41a, and FIG. 3B is a plan view of the bottom plate 41b. Referring to FIGS. 3A and 3B, the bottom plates 41a and 41b can be rectangular. Shorter sides L of the bottom plates 41a and 41b are longer than the diameter of the substrate W. Specifically, the length of the shorter sides L may be set to, for example, about 105 millimeters when the diameter of the substrate W is 100 millimeters. As shown in FIG. 3A, the bottom plate 41a has a plurality of through holes H arranged in an array. Fro example, the diameter of the through holes H can be about 0.5 millimeters. The intervals between the through holes H can be 5 to 6 millimeters, for example. As shown in FIG. 3B, the bottom plate 41b has a plurality of through holes h. The diameter of the through holes h can be about 0.5 millimeters. The intervals between the through holes h can be about 10 millimeters, for example.

Referring to FIG. 1 again, the tool 40 comprises the operation rod 45, and the tool 40 can be slid on the support base 30 by use of the operation rod 45. The tool 40 can be arranged such that the bottom portion of the boat 41 faces the substrate W positioned in the portion 30a. The tool 40 can be also positioned such that the frame portion 42b of the frame body 42 is situated over the substrate W. The tool 40 is made of high purity carbon like the support base 30. The tool 40 has its surface that contacts the support base 30, and preferably, the surface of the tool 40 is coated with a film, such as a SiC film.

The heater 20 is connected to a power supply unit. The power supply unit supplies electric power to the heater 20. The electric power is supplied to the heater 20 to generate radiant heat. This radiant heat serves to produce an increase in the temperature of the support base 30 and tool 40.

FIGS. 4A to 4D are views illustrating the method of diffusing zinc according to the first embodiment. With reference to FIGS. 4A to 4D, a method of diffusing zinc into the InP substrate according to the first embodiment will be a described. The first embodiment is carried out by use of the diffusion furnace 1.

(Step of Preparing Alloy)

First, the procedure of preparing an alloy will be described. The alloy is mainly composed of Sn, In, and P (hereinafter, referred as to Sn—In—P alloy). At the beginning, raw materials of Sn and In are prepared. For example, high purity Sn pellets and high purity In pellets can be used as these materials. Here, the high purity means a purity of about 99.999 percentages (%), for example.

Subsequently, the Sn material and In material are weighed to form a mixture of these raw materials. The molar ratio of In to Sn of the mixture is in a range of 0.65 to 1.3. If the molar ratio of In to Sn is lower than 0.65, Sn is easily evaporated from the mixture in heating the substrate W in a later step and then the InP substrate may be contaminated by the evaporated Sn. If the molar ratio of In to Sn in a Sn—In alloy is higher than 1.3, the phosphorus concentration cannot be sufficiently increased in the Sn—In alloy because the amount of InP that can be dissolved in the Sn—In alloy is limited depending on the In concentration when InP is dissolved into melted Sn and In in a later step. Therefore, a sufficient amount of phosphorus would not be able to be supplied to the vapor phase when heating the substrate W.

When the Sn—In—P alloy placed on the bottom plate 41b is melted in a later step, it is preferable that the melted Sn—In—P alloy covers all the through holes h arrayed in the bottom plate 41b. The total mass of materials of Sn and In is determined, so that a sufficient amount of the alloy is supplied to cover all the through holes h.

Subsequently, an InP material is prepared. Here, the InP material can be, for example, polycrystal pieces of high purity InP. The InP material may be also crushed pieces or powder of a high purity InP substrate. The mass of the InP material is determined such that solid InP remains in the melt of the alloy when the Sn—In—P alloy is produced in the later step. From the point of view of impurity in raw material, the InP material is preferable, but red phosphorus may be used instead of the InP material. When red phosphorus is used, it is preferable to determine the amount of red phosphorus so that solid red phosphorus remains in the melt of the alloy.

Figure 4A:
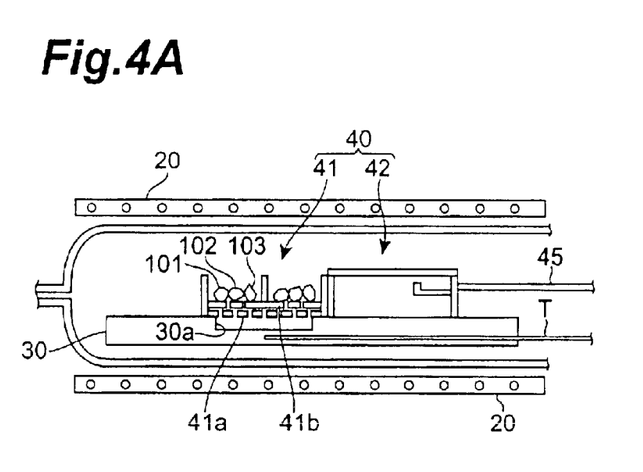
FIGS. 4A to 4D are views illustrating a method of zinc diffusion according to the first embodiment.

As shown in FIG. 4A, Sn material, In material, and InP material prepared as above are supplied in the boat 41 of the diffusion furnace 1. The heater 20 is then energized, and the Sn material, In material, and InP material are heated. The Sn material and In material are melted, and the InP material is dissolved into the melt of Sn and In. In the melt, a part of the InP material remains solid. The heating condition is exemplified in the following.

$H_2$ gas supply rate: 1 to 3 liters per minute
Heating temperature: 600 degrees centigrade
Heating time: 1 hour or more.

In this embodiment, although the heating temperature is set to 600 degrees centigrade, the heating temperature may be equal to or more than temperature (Zn diffusion temperature) at which the diffusion of Zn into the InP substrate W will be performed in the later step, and the heating temperature is not limited to the temperature as described above. Since InP material is preliminary dissolved into the melt of Sn and In at a temperature equal to or more than the Zn diffusion temperature as above, the phosphorus concentration in the Sn—In—P alloy has been saturated at the Zn diffusion temperature. Specifically, it is preferable that the temperature at which the melt of Sn and In is to be processed is higher than, by about 50 degrees centigrade, the Zn diffusion temperature at which the diffusion Zn is to be processed. In this way, the Sn—In—P alloy (hereinafter, referred as to the alloy 110) is obtained.

The energization of the heater 20 is stopped, and the temperature of the alloy 110 is gradually lowered to a temperature approximate to a room temperature. After the temperature has been lowered, the solid alloy 110 and the solid InP separated out from the alloy 110 is formed in the boat 41.

(Step of Preparing Zinc Diffusion Material)

Subsequently, a diffusion material is prepared for producing vapor of zinc and phosphorus. For example, pellets of zinc compound, such as zinc phosphide ($ZnP_2$) or trizinc phosphide ($Zn_3P_2$), can be used as the diffusion material. For example, a combination of pellets of Zn and pellets of red phosphorus may be also used as the diffusion material. Furthermore, a combination of pellets of $ZnP_2$ or $Zn_3P_2$ and pellets of red phosphorus can be used as the diffusion material.

(Step of Accommodating Substrate and Material)

Figure 4B:
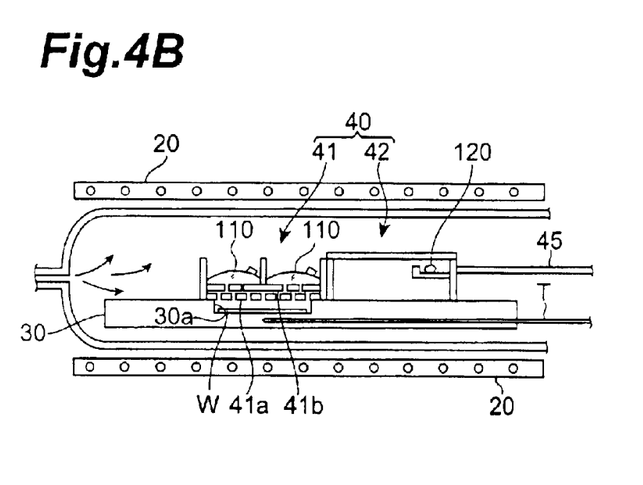

Next, as shown in FIG. 4B, the InP substrate W is placed in the portion 30a of the diffusion furnace 1, and the prepared diffusion material 120 is placed on the shelf portion 42c of the frame body 42. In FIG. 4B, the alloy 110 has already been placed in the boat 41.

(Step of Raising Substrate Temperature)

The operation rod 45 is operated to move the tool 40 to a position at which the bottom plate 41a faces the substrate W. Specifically, FIG. 4B shows a first arrangement of the boat 41 and the frame 42 in the furnace 1. Subsequently, $H_2$ gas is flown into the quartz tube 10 at a flow rate of 1 to 3 liters per minute, and the atmosphere in the quartz tube 10 is replaced with $H_2$. Thereafter, when the heater 20 is energized, the support base 30 and the tool 40 are heated by radiant heat from the heater 20, and the substrate W on the support base 30 and the alloy 110 in the tool 40 are heated. The temperature of the substrate W is monitored with the thermocouple T and is raised to a predetermined temperature, for example, in a range of 550 to 580 degrees centigrade. Then, Phosphors vapor is produced from the heated alloy 110. The Phosphors vapor from the alloy 110 passes through the through holes H of the bottom plate 41a, and then passes through the through holes h of the bottom plate 41b to space provided between the substrate W and the bottom plate 41b. As a result, the space over the substrate W is filled with the Phosphors vapor at a vapor pressure determined by the temperature of the alloy. In this way, the surface of the substrate W is exposed to the phosphors vapor, so that the sublimation of phosphorus from the substrate W is suppressed.

In the melted alloy 110, solid indium phosphorus remains. Accordingly, the phosphorus vapor is generated from the alloy 110, and the phosphorus concentration in the alloy 110 is always maintained at a saturated concentration.

The melt of the alloy 110 spreads on the bottom plate 41b and covers the through holes h of the bottom plate 41b. The sidewalls and bottom plate 41b of the boat 41 make the space between the substrate W and the bottom plate 41b airtight. Accordingly, the vapor of phosphorus is provided to the surface of the substrate W at a high pressure sufficient to surely suppress the loss of phosphorus.

(Zinc Diffusion Step)

Figure 4C:
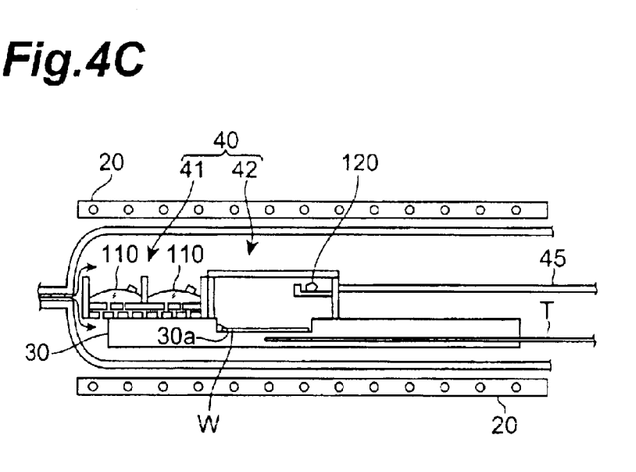

After the substrate W is heated to a predetermined temperature, the operation rod 45 is operated to move the tool 40 to a position at which the frame portion 42b of the frame body 42 is situated over the substrate W. Specifically, FIG. 4C shows a second arrangement of the boat 41 and the frame body 42 in the furnace 1. The diffusion material 120 in the shelf portion 42c of the frame body 42 is heated together with the substrate W, and vapor of Zn material and P material is produced from these materials. Therefore, the space between the substrate W and the bottom plate 41a is filled with the vapor of Zinc and phosphorus generated from the diffusion material 120. Accordingly, the vapor of zinc and phosphorus can prevent the loss of phosphorus from the substrate W due to the phosphorus vapor in the space, as well as allows the diffusion of Zn atoms into the substrate W. In this state, the temperature of the substrate W is maintained at the temperature, for a predetermined period of time, for example five minutes, to diffuse a desired amount of zinc into the substrate W.

(Temperature Lowering Step)

Figure 4D:
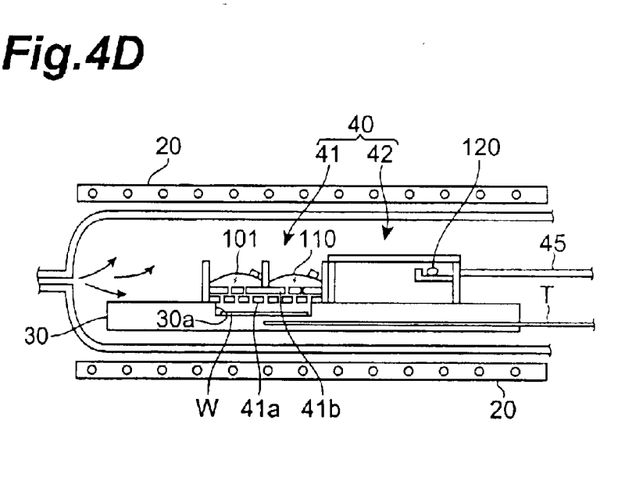

Subsequently, the operation rod 45 is operated to move the tool 40 to a position at which the bottom plate 41a faces the substrate W. Specifically, FIG. 4D shows a third arrangement of the boat 41 and the frame body 42 in the furnace 1. Thereafter, the energization of the heater 20 is stopped, and then the temperature of the substrate W begins to gradually decrease. When the temperature of the substrate W is as high as a temperature at which the loss of phosphorus significantly occurs, the temperature of the alloy is approximately as high as that of the substrate W, and thus the phosphorus vapor generated from the alloy exhibits a high pressure sufficient to avoid the loss of phosphorus from the substrate W. The pressure of the phosphorus vapor from the alloy decrease as the temperature of the alloy, and then the temperature of the substrate W decreases, so that there is no significant loss of phosphorus from the substrate W. Specifically, if the bottom plate 41a is faced to the substrate W, the vapor pressure of the phosphorus vapor is applied to the surface of the substrate W depending on the temperature. Accordingly, the temperature of the substrate W can be lowered without the loss of phosphorus. After the temperature of the substrate W is lowered approximately to the room temperature, the atmosphere in the quartz tube 10 is replaced with $N_2$ gas as shown in FIG. 4D. The substrate W is taken out. After the steps as above described, the process of Zn diffusion into the substrate W is completed.

In the first embodiment, Sn and In raw material of a molar ratio of In to Sn of 0.65 to 1.3 are melted, and InP is dissolved into the melt of Sn and In material, and then the alloy 110 is formed. In heating the substrate W, the tool 40 is positioned such that the bottom face of the boat 41 faces the substrate W, and then the alloy in the boat 41 is heated. After the heating of the alloy, phosphorus vapor is generated from the alloy. The phosphorus vapor passes through the through holes H of the bottom plate 41a, and then passes through the through holes h of the bottom plate 41b to space provided between the substrate W and bottom plate 41a. Therefore, the phosphorus vapor can prevent the loss of phosphorus from the substrate W because the surface of the substrate W is subjected thereto.

In diffusing Zn into the substrate W, the frame portion 42b of the frame body 42 is positioned over the substrate W. Accordingly, space between the substrate W and the frame body 42 is made airtight by the cover portion 42b and the frame portion 42a. In this arrangement, the space between the substrate W and the frame body 42 is filled with vapor of Zn and P generated from the diffusion material 120. Therefore, the phosphorus in the vapor can suppress the loss of phosphorus from the substrate W is ed by, and the zinc in the vapor serves to diffuse the Zn atoms into the substrate W.

In lowering the temperature of the substrate W, the tool 40 is moved to a position at which the bottom face of the boat 41 faces the substrate W, thereby preventing the loss of phosphorus from the substrate W as is the case with the heating of the substrate W.

In the first embodiment, since the alloy 110 is used, the following effects are provided. Specifically, the alloy 110 can be melted to spread on the bottom plate 41b during the heating. Therefore, if the sizes of the bottom plates 41a and 41b and the boat 41 are determined in light of the diameter of the substrate W, the alloy 110 can be used regardless of the diameter of the substrate W. If a dummy substrate is used, the diameter of the dummy substrate has to be larger than that of the InP substrate. It becomes difficult to obtain the dummy substrate as the diameter of the InP substrate is increased. However, in the process of diffusing zinc into the InP substrate with a relatively larger diameter, such as an InP substrate of 4 inches or more, the method according to the first embodiment allows the uniform exposure of the entire surface of the substrate W to the sufficient amount of P vapor if the bottom plates 41a and 41b and the boat 41 large is enough to cover the substrate.

The bottom plates 41a and 41b and the boat 41 can be made of carbon, which is less expensive than the dummy substrate. The bottom plates 41a and 41b and the boat 41 made of carbon can reduce costs required for the zinc diffusion step.

Furthermore, the number of reuse of the alloy 110 is larger than that of the dummy substrate. If the phosphorus concentration in the alloy lowers after the phosphorus in the alloy 110 has been consumed due to its repeated use, then the alloy can be repeatedly recovered by replenishing phosphorus to the alloy. On the other hand, if the dummy substrate is employed, the surface of the dummy substrate becomes In-rich due to the repeated use and the surface of the substrate needs to be etched so as to generate sufficient phosphorus vapor. The repeated use of the dummy substrate reduces its thickness because etching is carried out to produce the flesh surface of the dummy substrate. The dummy substrate cannot be used at the end. According to knowledge of the inventors, the dummy substrate can be reused about three times. Therefore, in a method of diffusing zinc according to the present embodiment, costs can be reduced compared to the use of the dummy substrate, since the alloy 110 can be used repeatedly.

Still furthermore, the surface of the substrate W is surely exposed to the phosphorus vapor because the melted alloy spreads over the entire surface of the bottom plate 41b of the boat 41 to surely cover the through holes h, and the space over the substrate W is surely made airtight.

Figure 5:
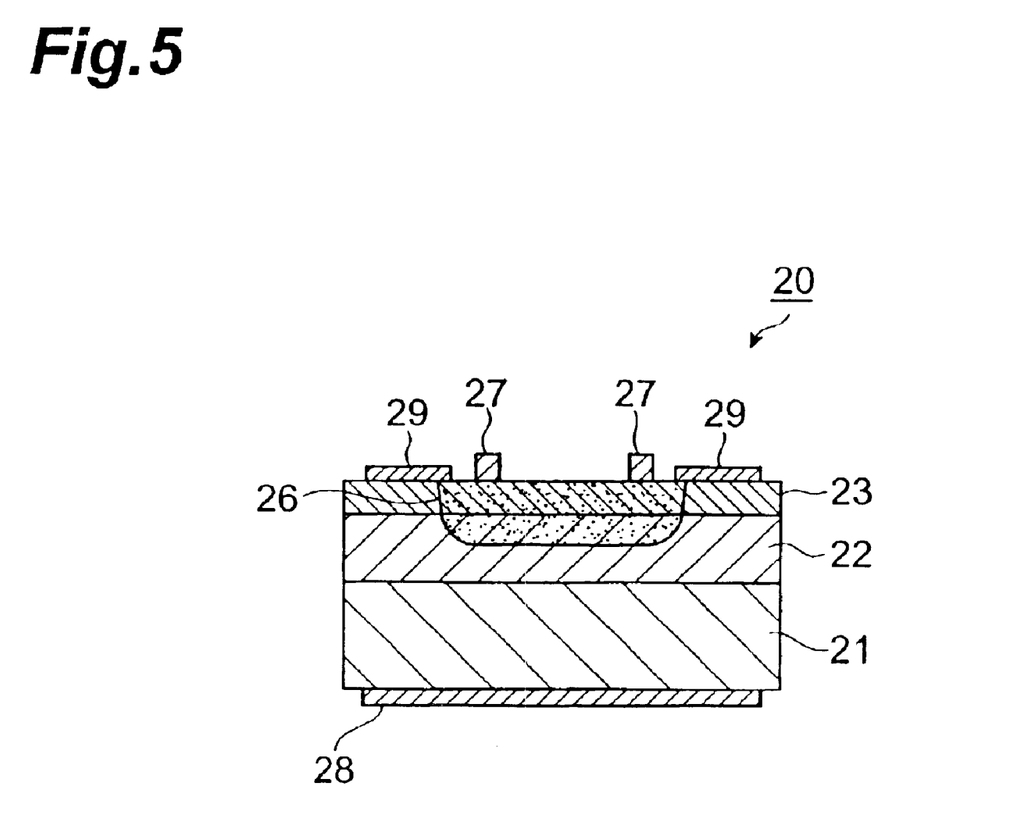
FIG. 5 is a cross-sectional view showing a structure of a photodiode.

The inventors have manufactured a photodiode for optical communication by use of the method of zinc diffusion of the first embodiment. FIG. 5 is a cross-sectional view showing a structure of the photodiode. As shown in the drawing, a photodiode 20 includes an n-type InP substrate 21, a light absorption layer 22 provided on the sustrate 21, and a window layer 23 provided on the light absorption layer 22. The light absorption layer 22 can be formed of n-type InGaAs, and the window layer 23 can be formed of n-type InP. The photodiode 20 includes a diffusion region 26. Zinc dopant is supplied to form the diffusion region 26, and thus a p-n junction is formed in an interface between the diffusion region 26 and each of the light absorption layer 22 and the window layer 23. Electrodes 27 are formed on the diffusion region 26, and an electrode 28 is formed on a back face of the substrate 21. Moreover, a passivation film 29 can be formed of silicon nitride outside the diffusion region 26.

The diffusion region 26 can be formed by the method of zinc diffusion of the first embodiment. Specifically, after forming of the passivation film 29 having an opening, the p-type dopant is diffused therethrough to form the region 26. Subsequently, by the above described method of zinc diffusion, Zn can be diffused from the surface of the window layer 23 (InP) exposed at the opening into the window layer 23 and the light absorption layer 24 to form the diffusion region 26. Forty thousand (400) photodiodes 20 have been manufactured on a 4-inch InP substrate and have been formed into photodiode chips. Then, dark current for these photodiode chips has been measured, and the measurement reveals that the photodiodes all over the 4-inch InP substrate exhibit excellent property. This good yield results from the uniform diffusion of zinc and the reduction of occurrence of defects caused by the loss of phosphorus by use of the method of zinc diffusion according to the first embodiment.

Figure 6A:
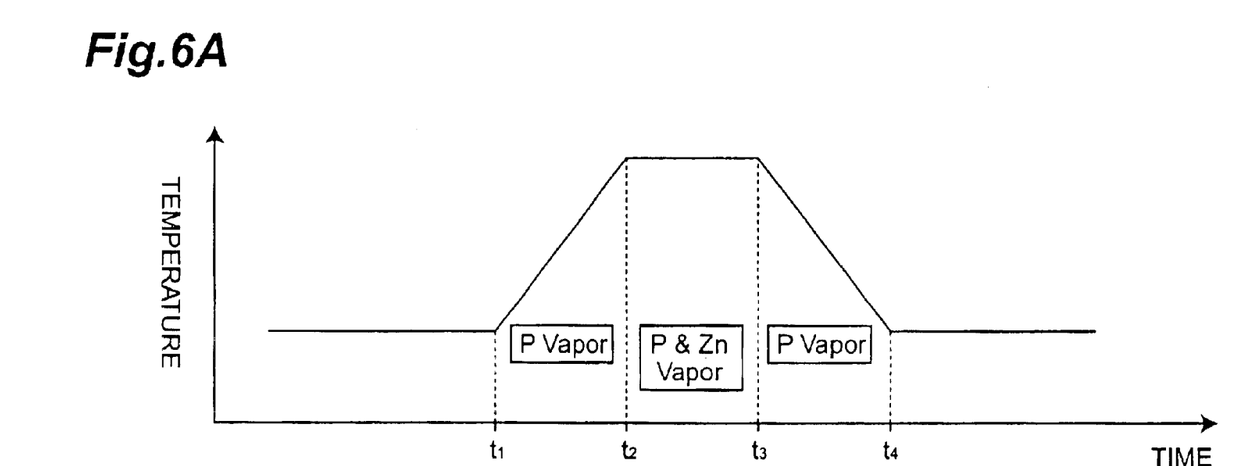
FIG. 6A shows a characteristic line indicating the change of the temperature in the furnace.
Figure 6B:
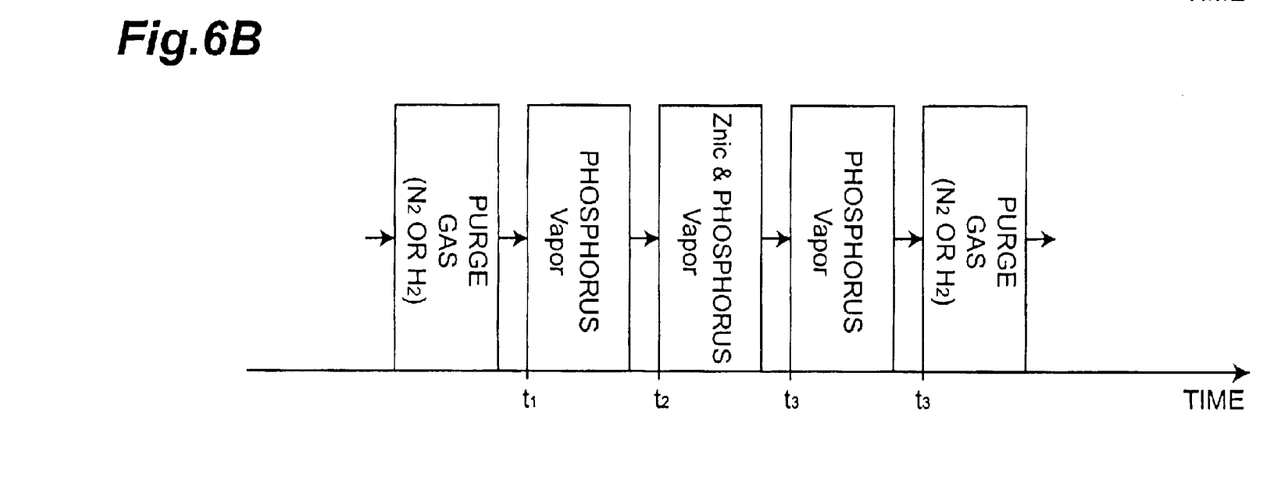
FIG. 6B is a flowchart showing the change of the vapor in this method.

FIG. 6A shows a characteristic line indicating the change of the temperature. FIG. 6B shows a characteristic line indicating the change of the vapor in this method. Referring to FIGS. 6A and 6B, the temperature of the furnace starts to arise from a room temperature at time t1. The Sn—P—In source supplies the vapor of phosphorus and the surface of the substrate is exposed to an atmosphere containing the vapor of phosphorus. The vapor pressure of phosphorus is increased as the temperature of the furnace is raised. The temperature reaches a predetermined temperature at time t2, and the surface of the substrate is exposed to an atmosphere containing vapor of zinc and phosphorus. The temperature is kept constant during the diffusion of zinc. The temperature of the furnace starts to lower from the predetermined temperature to a room temperature at time t3, and the surface of the substrate is exposed to an atmosphere containing vapor of phosphorus, not zinc. The vapor pressure of phosphorus is decreased as the temperature of the furnace is lowered. At time t4, the temperature of the furnace reaches the room temperature.

(Second Embodiment)

Next, a description will be made of an embodiment of a method of heating a semiconductor substrate according to the present invention. A second embodiment can be carried out using the furnace 1 as well. The second embodiment differs from the first embodiment only in a point of not including the zinc diffusion step. The second embodiment will be described below with reference to FIGS. 4A to 4D, which are referred to in the description of the first embodiment. Although the diffusion material 120 is shown in FIGS. 4A to 4D, the diffusion material 120 is not required in the second embodiment. A substrate to be heated by the heating method of the second embodiment may be an InP substrate containing dopant atoms ion-implanted, such as Si, S, Se and Zn.

(Step of Heating Substrate)

First, an alloy (hereinafter, alloy 110) mainly composed of Sn, In, and P is prepared in accordance with the alloy preparation step in the first embodiment. Next, similarly as shown in FIG. 4B, the InP substrate W is placed in the receiving portion 30a of the furnace 1. Please note that a zinc source is not needed in this embodiment. The alloy 110 has already been placed on the boat 41. After placing the alloy 110 on the portion 30a, the position of the tool 40 is adjusted using the operation rod 45 such that the bottom plate 41a of the boat 41 faces the substrate W. The heater 20 is then energized to heat the support base 30 and the tool 40, and the substrate W and the alloy 110 are heated. From the heated alloy 110, phosphorus vapor is generated.

(Step of Maintaining Substrate Temperature)

The bottom plate 41a faces the substrate W. After the temperature of the substrate W reaches a predetermined temperature, the surface of the substrate W is exposed for a predetermined period of time to the phosphorus vapor generated from the alloy 110. Here, the predetermined temperature may be set to, for example, 600 to 650 degrees centigrade. When the substrate W is placed at that temperature, the heat process can activate dopant atoms ion-implanted into the substrate W to form donors or acceptors in the substrate W, and can recovers or anneals damage introduced into the substrate W in ion-implantation.

(Step of Lowering Temperature)

After a predetermined period of time, the energization to the heater 20 is stopped, and the temperature of the substrate W is lowered. As described above, since the bottom plate 41a faces the surface of the substrate W, the temperature of the substrate W can be lowered without causing the loss of phosphorus from the substrate W. After the temperature of the substrate W is lowered approximately to the room temperature, the atmosphere in the quartz tube 10 is replaced with $N_2$ gas, and the substrate W is taken out. With the steps described above, the heating of the substrate W is finished.

In the second embodiment, the bottom plate 41a faces the surface of the substrate W in respective steps of raising the substrate temperature, keeping the substrate temperature constant, and lowering the temperature. Therefore, the substrate W can be heated without the loss of phosphorus from the substrate W because the surface of the substrate W is exposed to phosphorus vapor from the alloy 110 in all of the period of the heating.

Examples of using a Sn—In—P alloy are described in a document 1 (P. Besomi et al., J. Appl. Phys. 54(1983) pp. 535–539.) and a document 2 (G. A. Antypas, Appl. Phys. Lett. 37(1980) pp. 64–65.). In the examples of these documents, the Sn—In—P alloy is produced from the heating of Sn and InP. In the manners of the documents, an amount of InP dissolvable into Sn is determined by solubility limit of phosphorus. Consequently, the concentration of In in the dissolved Sn—In—P alloy cannot be increased. According to the document 1, the molar ratio $X_{In}$ of In in the alloy is equal to or more than 0.07 and equal to or less than 0.2 ($0.07 \leq X_{In} \leq 0.2$). According to knowledge of the inventors, Sn is easily evaporated in the range of the molar ratios, and the InP substrate is contaminated by the Sn vapor. The contamination of the InP substrate by Sn changes a carrier concentration of the InP substrate because Sn serves as a donor umpurity in InP. Moreover, when a p-type InP substrate is heated, the conductivity type may be turned into an n-type.

The inventors have examined the effect of Sn. The result will be described below. The examination has been carried out by the following manner: (1) measuring the concentration of residual Sn in the InP substrate by the Secondary Ion Mass Spectrometry (SIMS), (2) heating the InP substrate by the heating method according to the second embodiment, and (3) after the heating, measuring the Sn concentration by use of SIMS.

Figure 7A:
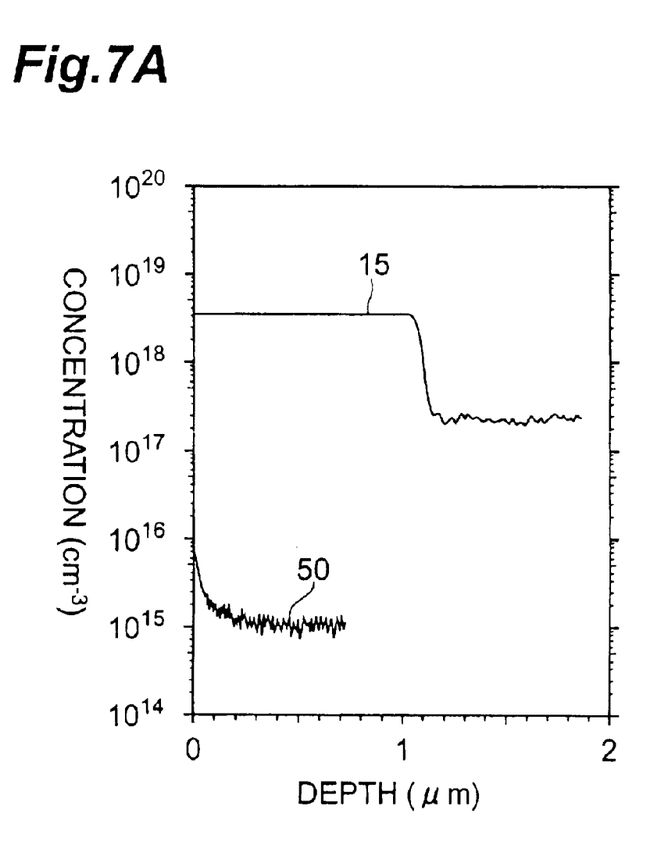
FIG. 7A is a graph showing a result of SIMS measurement of an InP substrate before heating the InP substrate.
Figure 7B:
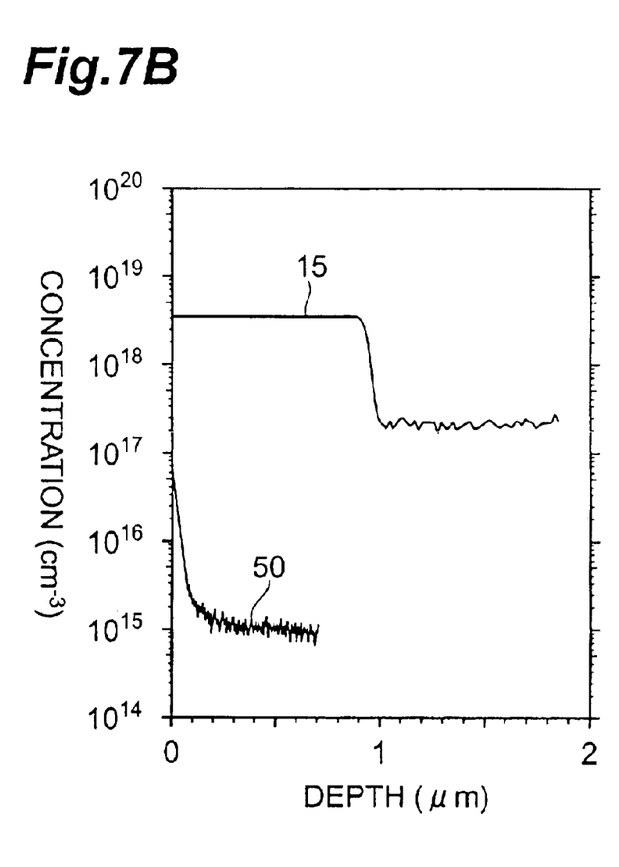
FIG. 7B is a graph showing a result of SIMS measurement of the InP substrate after heating the InP substrate.

FIG. 7A is a graph showing a result of the SIMS measurement of the InP substrate before heating. FIG. 7B is a graph showing a result of the SIMS measurement of the InP substrate after heating. In FIGS. 7A and 7B, the axis of ordinate indicates concentration, and the axis of abscissas indicates depth taken from the surface of the substrate. The concentration in the drawings is calibrated based on the result of a standard sample. In FIGS. 7A and 7B, Line 50 indicates the Sn concentration in the sample, and Line 15 indicates the phosphorus concentration in the sample. With reference to FIG. 6A, even before the InP substrate is heated, Sn remains in the InP substrate at a concentration of about $1 \times 10^{15}$ to $9 \times 10^{15}$ cm$^{-3}$. As shown in FIG. 6B, after the InP substrate is heated, the Sn concentration is slightly increased to about $7 \times 10^{16}$ cm$^{-3}$ at the surface of the substrate, but about $1 \times 10^{15}$ cm$^{-3}$ in an internal portion of the the substrate. Even after the heating, there is no substantial increase in concentration that would become a problem on a practical use. The result as described above reveals that, in the method of heating the InP substrate according to the second embodiment, the contamination by Sn can be suppressed to a negligible extent.

The reason for the above results may be as follows. Material containing Sn and In, which are prepared in a molar ratio of In to Sn of 0.6 or more but not exceeding 1.3, are melted by heating, and InP is dissolved into the melt of Sn and In, thereby obtaining the Sn—In—P alloy. The In concentration in the Sn—In—P alloy can be made higher than that in an alloy which InP is dissolved into the melt of Sn to form. An evaporation amount of Sn from the Sn—In—P alloy may be reduced because of the high In concentration in the alloy. The method of heating a semiconductor substrate and the method of diffusing zinc into a semiconductor substrate according to the present invention have an advantage that the contamination of the InP substrate by Sn can be suppressed.

Figure 8A:
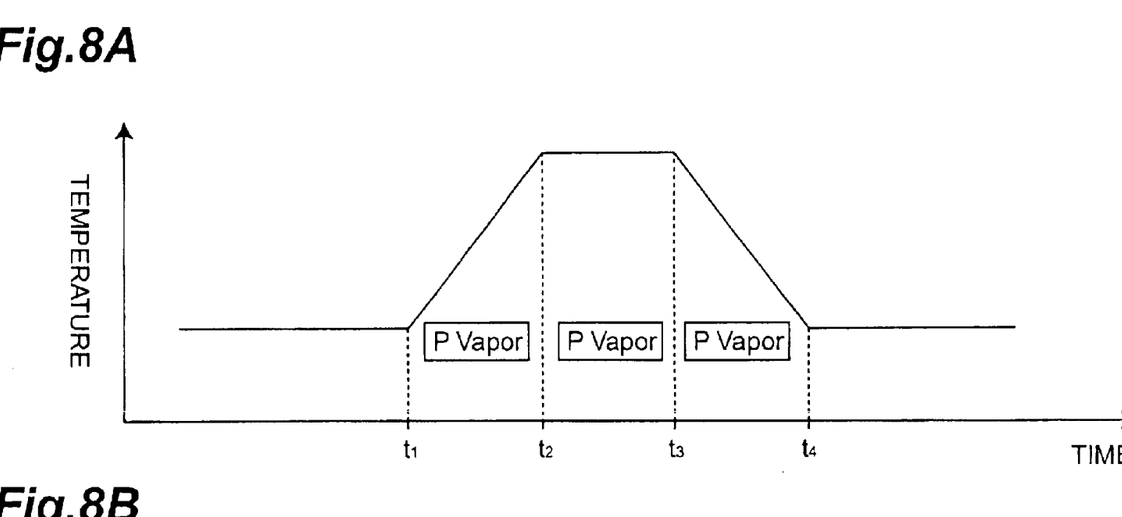
FIG. 8A shows a characteristic line indicating the change of the temperature in the furnace.
Figure 8B:
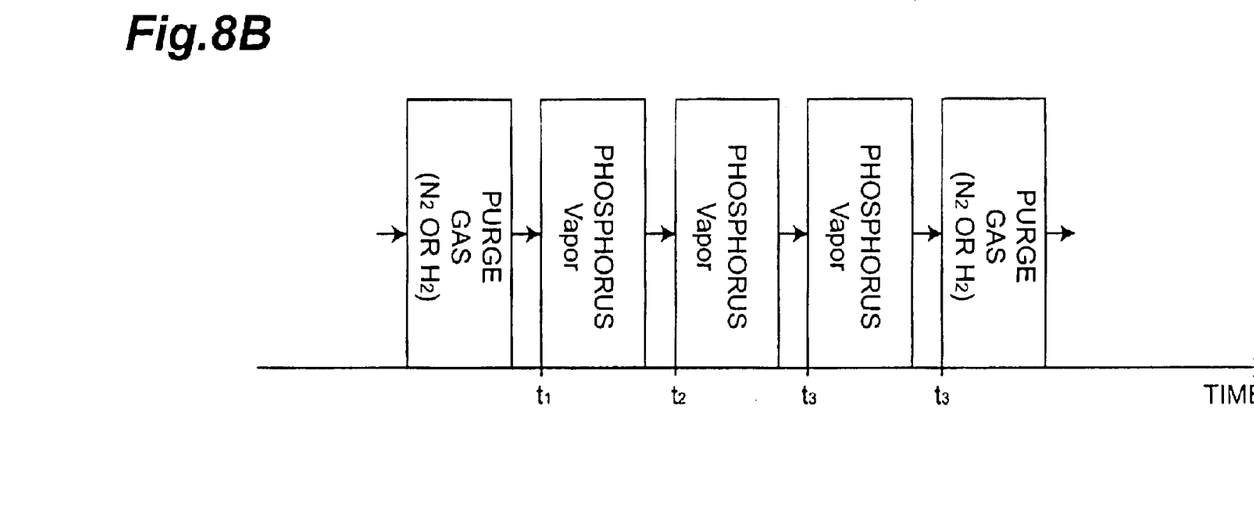
FIG. 8B is a flowchart showing the change of the vapor in this method.

FIG. 8A shows a characteristic line indicating the change of the temperature. FIG. 8B shows a characteristic line indicating the change of the vapor in this method. Referring to FIGS. 8A and 8B, the temperature of the furnace starts to arise from a room temperature at time t1. The Sn—P—In source supplies the vapor of phosphorus and the surface of the substrate is exposed to an atmosphere containing the vapor of phosphorus. The vapor pressure of phosphorus is increased as the temperature of the furnace is raised. The temperature reaches a predetermined temperature at time t2, and the surface of the substrate is exposed to an atmosphere containing vapor of phosphorus, not zinc. The temperature is kept constant during the annealing of the substrate. The temperature of the furnace starts to lower from the predetermined temperature to a room temperature at time t3, and the surface of the substrate is exposed to an atmosphere containing vapor of phosphorus, not zinc. The vapor pressure of phosphorus is decreased as the temperature of the furnace is lowered. At time t4, the temperature of the furnace reaches the room temperature.

(Third Embodiment)

Figure 9:
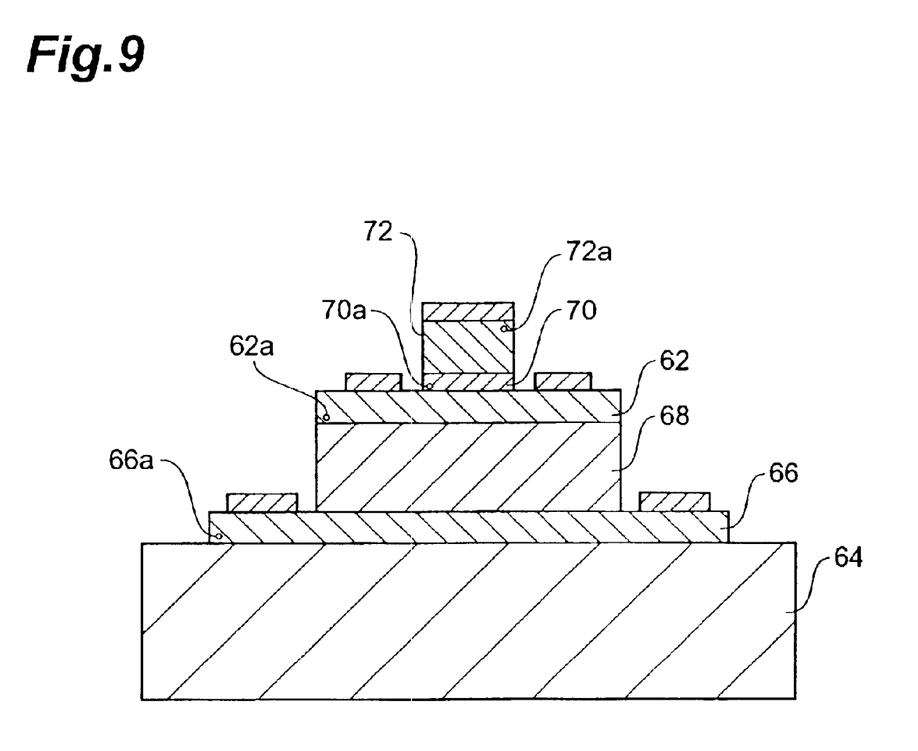
FIG. 9 is a cross-sectional view showing a structure of a hetero-junction bipolar transistor.

FIG. 9 is a cross sectional view showing a hetero-junction bipolar transistor. The hetero-junction bipolar transistor 60 has a III-V semiconductor base layer 62 containing carbon dopant atoms 62a, such as a InGaAs layer. In addition to the InGaAs base layer 62, the hetero-junction bipolar transistor 60 has a semi-insulating InP substrate 64, a InGaAs sub-collector layer 66 containing n-type dopant atoms 66a, an undoped InGaAs collector layer 68, a InP emitter layer 70 containing n-type dopant atoms 70a and a InGaAs emitter-cap layer 72 containing n-type dopant atoms 72a. The dopant of the base layer 62 can be carbon or zinc. The base layer 62 needed to be heavily doped and it is favorable that the concentration thereof be more than $1*10^{+19}$ cm$^{-3}$. Carbon is preferred to zinc because the diffusion efficient of carbon is smaller than that of zinc. Carbon doped semiconductor layers are formed in Metal Organic Vapor Phase Epitaxy method and some of the carbon atoms in the layers are deactivated due to hydrogen atoms contained in the raw materials of the deposition, such as arshin (AsH$_3$) and phosphine (PH$_3$) In order to reactivate the deactivated carbon atoms, the carbon doped base layers have to be thermally annealed to decompose the chemical bonding between carbon atoms and hydrogen atoms in the layers. After the thermal annealing, the carbon atoms are activated to form acceptors, i.e., re-activated.

On an Fe-doped InP substrate, a Si-doped InGaAs semiconductor layer, a carbon-doped InGaAs semiconductor layer, a Si-doped InP semiconductor layer are epitaxitially grown. The dopant concentrations of these layers are as follows. Si-doped InGaAs semiconductor layer: $1*10^{+17}$ cm$^{-3}$ carbon-doped InGaAs semiconductor layer: $3*10+19$ cm$^{-3}$ Si-doped InP semiconductor layer: $5*10^{+17}$ cm$^{-3}$ These concentrations are measured in a Secondary Ion Mass Spectroscopy (SIMS) Method. The carrier concentration of the carbon-doped InGaAs semiconductor layer as grown is about $1*10^{+19}$ cm$^{-3}$, and this value is one third of that of the estimation by a SIMS result, $3*10^{+19}$ cm$^{-3}$. The hydrogen concentration of the carbon-doped InGaAs semiconductor layer as grown is measured in the SIMS Method and is $2*10^{+19}$ cm$^{-3}$. In the carbon-doped InGaAs semiconductor layer, the carrier density and the hydrogen concentration are consistent with each other.

Two samples are prepared for comparison. The furnace is used to anneal a carbon-doped InGaAs semiconductor layer of one sample for ten minutes at 500 degree centigrade in an atmosphere containing phosphorus as described in the second embodiment. Nitrogen (N$_2$) gas is supplied as a purge gas from the gas supply source 12 to the quartz tube 10 at a flow rate of about 1 to 3 liters per minute. After this annealing, the carrier concentration of the carbon-doped InGaAs semiconductor layer is increased to about $2.8*10^{+19}$ cm$^{-3}$. The latter heating method is superior to the former heating method. During the former annealing, PH$_3$ molecules are decomposed to produce phosphorus and hydrogen. An atmosphere in the former method contains hydrogen atoms that may degrade the activation ratio of the carbon dopants in the semiconductor layer. But, an atmosphere in the latter method does not contain any hydrogen atoms generated from the source.

An OMVPE chamber is used to anneal a carbon-doped InGaAs semiconductor layer of the other sample for ten minutes at 500 degree centigrade in the flow of PH$_3$ gas. After this annealing, the carrier concentration of the carbon-doped InGaAs semiconductor layer is increased to about $2*10^{+19}$ cm$^{-3}$.

Figure 10A:
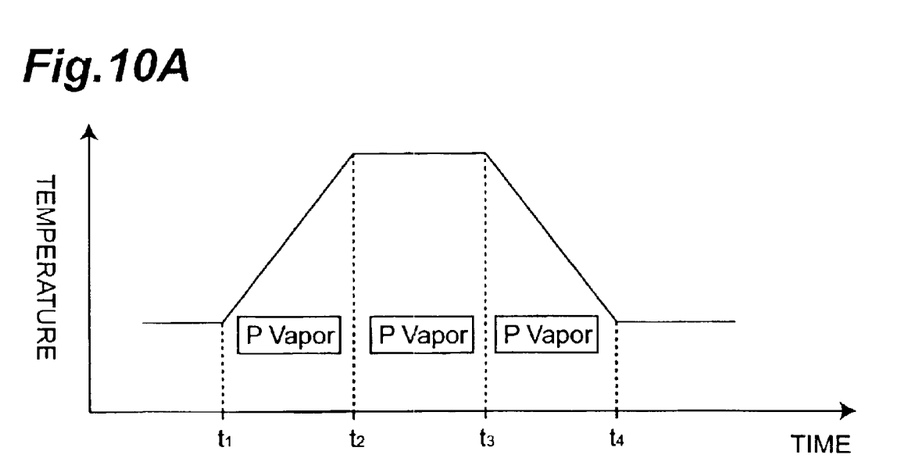
FIG. 10A shows a characteristic line indicating the change of the temperature in the furnace.
Figure 10B:
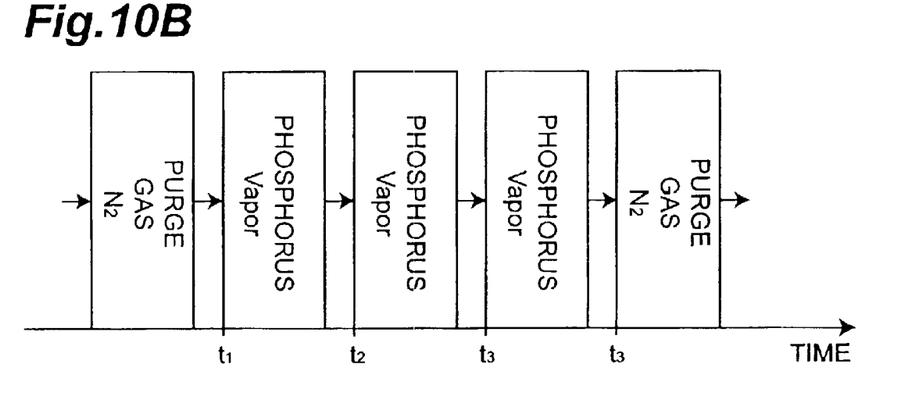
FIG. 10B is a flowchart showing the change of the vapor in this method in the former method.
Figure 10C:
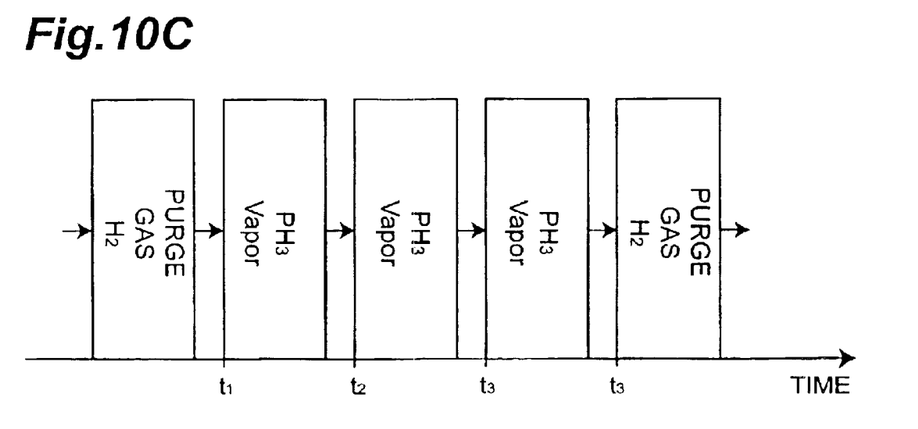
FIG. 10C shows a characteristic line indicating the change of the vapor in the latter method.

FIG. 10A shows a characteristic line indicating the change of the temperature. FIG. 10B shows a characteristic line indicating the change of the vapor in the former method, and FIG. 10C shows a characteristic line indicating the change of the vapor in the latter method. Referring to FIGS. 10A and 10B, the temperature of the furnace starts to arise from a room temperature at time t1. The Sn—P—In source supplies the vapor of phosphorus and the surface of the substrate is exposed to an atmosphere containing the vapor of phosphorus. The vapor pressure of phosphorus is increased as the temperature of the furnace is raised. The temperature reaches a predetermined temperature at time t2, and the surface of the substrate is exposed to an atmosphere containing vapor of phosphorus, not zinc. The temperature is kept constant during the annealing of the substrate. The temperature of the furnace starts to lower from the predetermined temperature to a room temperature at time t3, and the surface of the substrate is exposed to an atmosphere containing vapor of phosphorus, not zinc. The vapor pressure of phosphorus is decreased as the temperature of the furnace is lowered. At time t4, the temperature of the furnace reaches the room temperature. Referring to FIG. 10C, phosphorus vapor is supplied from the flow of PH$_3$ gas. The annealing is carried out in an atmosphere containing phosphorus and hydrogen from the PH$_3$ gas.

With reference to a number of embodiments, the description has been made of the method of heating a semiconductor substrate and the method of diffusing zinc into a semiconductor substrate according to the present invention. However, the present invention is not limited to the embodiments and various modifications and changes can be made. In the second embodiment, the alloy may be accommodated in a quartz vessel or container instead of the boat 41, and the vessel and the substrate may be placed in a predetermined heating furnace. In this case, the vessel or container is placed on an upstream of the purge gas flow with respect to the substrate in the heating furnace of an open tube type. In this type, the surface of the substrate can be exposed to the phosphorus vapor from the alloy.

In the first and second embodiments, the description has been made in terms of the substrate W as an InP substrate. However, it is obvious that the present invention is preferably applied to not only the InP substrate but also the GaP substrate and the GaAs substrate having a semiconductor film, such as Ga$_x$In$_{1-x}$P (0<x<1), grown on the surface.

The bottom plates 41a and 41b shown in FIGS. 2A and 2B are just exemplified, and the bottom plates 41a and 41b are not limited to these specific shapes. For example, the diameter of the through holes is not limited to 0.5 millimeters, and the diameter of the through holes can be used if the diameter of the through holes is provided such that the phosphorus vapor generated from the melt of the alloy 110 is sufficiently supplied to the surface of the substrate W as well as the melt of the alloy 110 is not flown down through the through holes. The number of through holes may be appropriately determined such that the surface of the substrate W is sufficiently exposed to the phosphorus vapor. The number of boats in the tool may be one or three or more.

In the first and second embodiments, the furnace 1 is used for obtaining the alloy 110, but another furnace may be used. If the other furnace is used, the prepared alloy 110 is supplied to the boat 41 in the furnace 1 when the substrate W is placed on the support base 30.

Although several numerical values, such as the condition for obtaining the alloy in the step of preparing the alloy, are exemplified, these numerical values are not limited thereto and can be appropriately determined to obtain a desired alloy.

In the bottom portion of the frame body, a bottom plate may have through holes similar to those in the bottom plate 41a or 41b. With the bottom plate, the diffusion material 120 can be placed on the bottom plate, not on the shelf portion 42c. With this bottom plate, the vapor of Zn and P generated from the diffusion material 120 can reach the region over the semiconductor substrate via the through holes. Accordingly, zinc can be diffused into the semiconductor substrate without the sublimation of phosphorus from the semiconductor substrate.

What is claimed is:

1. A method of diffusing zinc into an article having a surface of a III-V compound semiconductor containing phosphorus as a group V constituent element, the method comprising the steps of:

providing the article, an alloy, and a material source containing zinc and phosphorus in a heating furnace, the alloy including tin, indium and phosphorus as main constituents, the alloy being provided in a first container having a bottom portion thereof, the first container having a plurality of through holes in the bottom portion, the first container being provided in the heating furnace such that the bottom portion faces the surface of the article, and the material source being provided in a second container having a bottom portion thereof in the heating furnace, the second container having an opening in the bottom portion thereof;

increasing a temperature of the article in an atmosphere containing vapor of phosphorus supplied from the alloy, the first container being provided such that the bottom portion of the first container faces the article; and exposing a surface of the article in an atmosphere containing vapor of zinc and phosphorus from the material source to diffuse zinc into the article, the second container being provided over the article.

2. The method of diffusing zinc into an article according to claim 1, wherein the alloy is produced from a combination of a tin material and an indium material, and at least one of an indium phosphorus material and a phosphorus material; and wherein the combined material is prepared in a molar ratio of indium to tin of 0.65 or more but not exceeding 1.3.

3. The method of diffusing zinc into an article according to claim 1, further comprising the step of:

lowering temperature of the article in an atmosphere containing vapor of phosphorus generated from the alloy, after exposing the surface of the article in the atmosphere containing vapor of zinc and phosphorus.

4. The method of diffusing zinc into an article according to claim 3, wherein, in the step of lowering a temperature of the article, the first container is provided such that the bottom portion of the first container faces the article.

5. The method of diffusing zinc into an article according to claim 1, wherein the alloy is formed by heating a tin material, an indium material, and at least one material of an indium phosphorus material and a phosphorus material at a second temperature equal to or higher than a first temperature in the exposure of the article.

6. The method of diffusing zinc into an article according to claim 1, wherein the alloy includes at least one of solid indium phosphorus and solid phosphorus when the surface of the article is exposed to the vapor of phosphorus supplied from the alloy.

7. The method of diffusing zinc into an article according to claim 1, wherein the article includes a semiconductor substrate.

8. The method of diffusing zinc into an article according to claim 1, wherein the III-V compound semiconductor includes at least one of InP semiconductor, GaP semiconductor and GaInP semiconductor.

9. A method of heating an article having a surface of a III-V compound semiconductor containing phosphorus as a group V constituent element, the method comprising the steps of:

providing an alloy in a heating furnace, the alloy including tin, indium, and phosphorus as main constituents; the alloy being provided in a container having a bottom portion thereof, the container having a plurality of through holes in the bottom portion thereof, and the container being provided in the heating furnace such that the bottom portion of the container faces the surface of the article; and raising a temperature of the article in an atmosphere containing vapor of phosphorus supplied from the alloy.

10. The method of heating an article according to claim 9, wherein the alloy is produced from a combination of a tin material and an indium material, and at least one of an indium phosphorus material and a phosphorus material; and wherein the combined material is prepared in a molar ratio of indium to tin of 0.65 or more but not exceeding 1.3.

11. The method of heating an article according to claim 9, further comprising the step of:

exposing the surface of the article to an atmosphere containing vapor of phosphorus supplied from the alloy for a predetermined period of time, after the step of raising the temperature of the article.

12. The heating method of an article according to claim 9, further comprising the step of:

lowering a temperature of the article while exposing the surface of the article to an atmosphere containing vapor of phosphorus supplied from the alloy, after the step of exposing the surface of the article.

13. The method of heating an article according to claim 9, further comprising the step of:

exposing the surface of the article to an atmosphere containing vapor of phosphorus supplied from the alloy for a predetermined period of time, after the step of raising the temperature of the article, the bottom portion of the container facing the surface of the article in the step of exposing the surface of the article to an atmosphere containing vapor of phosphorus supplied from the alloy.

14. The method of heating an article according to claim 9, wherein the alloy is formed by heating a tin material, an indium material, and at least one material of an indium phosphorus material and a phosphorus material at a temperature equal to or higher than that in the exposure of the article.

15. The method of heating an article according to claim 9, wherein the alloy includes at least one of solid indium phosphorus and solid phosphorus when the surface of the article is exposed to an atmosphere containing vapor of phosphorus supplied from the alloy.

16. The method of heating an article according to claim 9, wherein the article includes a semiconductor substrate.

17. The method of heating an article according to claim 9, wherein the III-V compound semiconductor includes at least one of InP semiconductor, GaP semiconductor, and GaInP semiconductor.

18. The method of heating an article according to claim 9, wherein the article includes an InGaAs layer containing carbon dopant atoms.

19. The method of heating an article according to claim 9, wherein the article includes a III-V semiconductor base layer for a hetero-junction bipolar transistor, the III-V semiconductor base layer containing carbon dopant atoms.

* * * * *